United States Patent
Furukawa (10) Patent No.: US 8,259,448 B2
(45) Date of Patent: Sep. 4, 2012

(54) IMAGE DISPLAY DEVICE

(75) Inventor: Takayuki Furukawa, Osaka (JP)

(73) Assignee: Panasonic Corporation, Osaka (JP)

( * ) Notice: Subject to any disclaimer, the term of this patent is extended or adjusted under 35 U.S.C. 154(b) by 100 days.

(21) Appl. No.: 12/869,370

(22) Filed: Aug. 26, 2010

(65) Prior Publication Data

US 2011/0103013 A1 May 5, 2011

(30) Foreign Application Priority Data

Aug. 31, 2009 (JP) .................................. 2009-199431

(51) Int. Cl.
H05K 7/20 (2006.01)

(52) U.S. Cl. ............... 361/695; 361/679.21; 361/679.48; 313/582; 313/587; 313/634; 349/58; 349/60

(58) Field of Classification Search .................... 361/679.46–679.49, 690–697, 361/724–727, 825, 831; 165/121–126; 454/184; 349/58, 60–65, 161; 313/582, 587, 634; 181/141, 208, 286, 225, 202, 290, 206, 198, 181/226

See application file for complete search history.

(56) References Cited

U.S. PATENT DOCUMENTS

| | | | |
|---|---|---|---|
| 6,488,378 B1 | 12/2002 | Tabuchi et al. | |
| 6,513,936 B1 | 2/2003 | Ishiwa et al. | |
| 7,561,152 B2 * | 7/2009 | Hori et al. | 345/205 |
| 7,755,893 B2 * | 7/2010 | Yanagawa et al. | 361/695 |
| 7,990,701 B2 * | 8/2011 | Yeh et al. | 361/679.48 |
| 2005/0271521 A1 * | 12/2005 | Kim et al. | 417/126 |
| 2007/0081109 A1 | 4/2007 | Igarashi | |

FOREIGN PATENT DOCUMENTS

| | | | |
|---|---|---|---|
| JP | 2-019999 | | 5/1990 |
| JP | 2000124624 A | * | 4/2000 |
| JP | 2002311505 A | * | 10/2002 |
| KR | 2004061806 A | * | 7/2004 |

* cited by examiner

Primary Examiner — Michail V Datskovskiy
(74) Attorney, Agent, or Firm — Hamre, Schumann, Mueller & Larson, P.C.

(57) ABSTRACT

An image display device is provided with a chassis supporting a display panel on its front surface, circuit boards arranged within a specific region of the back surface of the chassis, a back cover having an edge portion that covers the outside of the specific region of the back surface of the chassis and a projecting portion that accommodates the circuit boards, and a fan arranged inside the space defined by projecting portion. The projecting portion includes a main wall and a peripheral wall, and the peripheral wall is provided with an air inlet and an air outlet. The edge portion is provided with a sound absorbing material on its outer wall surface in the vicinity of the air outlet.

2 Claims, 6 Drawing Sheets

IMAGE DISPLAY DEVICE

BACKGROUND OF THE INVENTION

1. Field of the Invention

The present invention relates to an image display device for displaying images, such as television images.

2. Description of Related Art

In recent years, with the reduction in thickness of image display devices for displaying images such as television images, image display devices using a flat display panel such as a plasma display panel and a liquid crystal panel have become a mainstream, instead of conventional CRTs.

Figure 4:
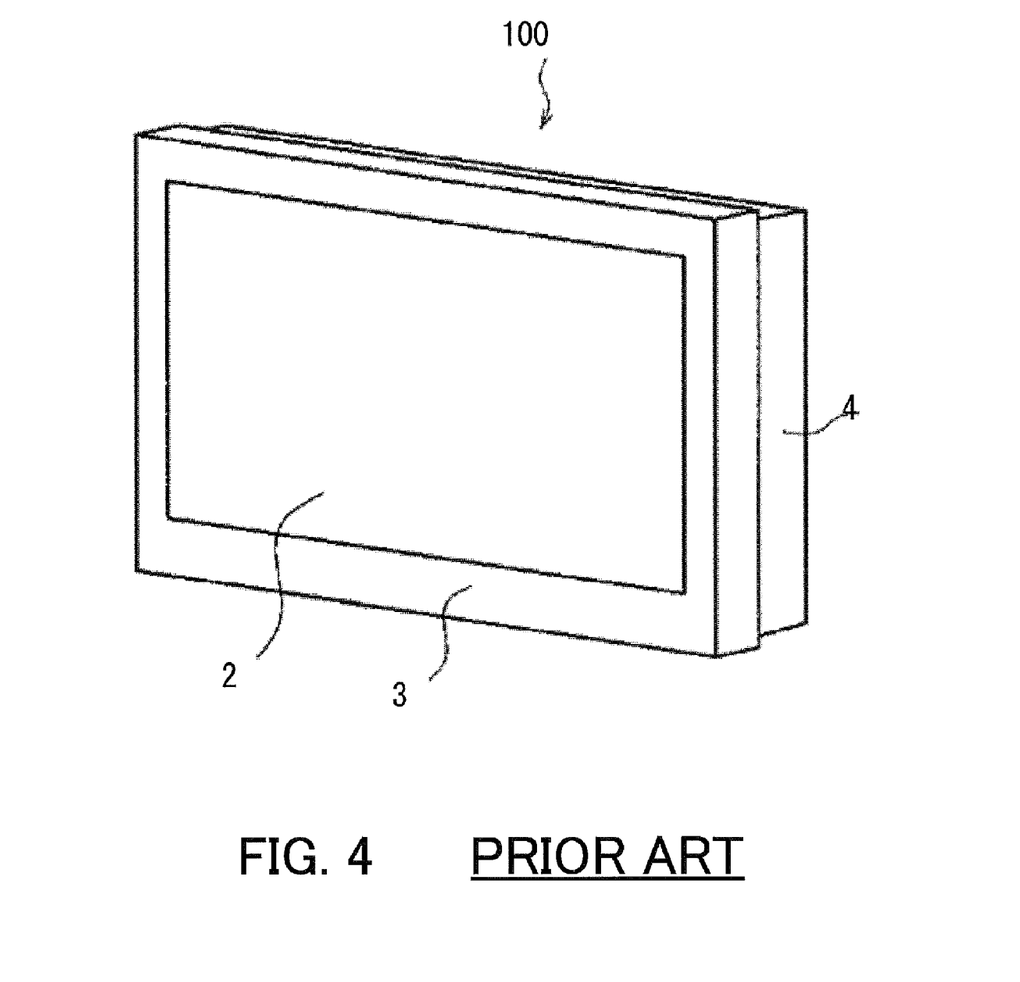
FIG. 4 is a schematic perspective view illustrating a conventional plasma display device.

FIG. 4 is a perspective view showing a plasma display device as an example of such a flat image display device, viewed from the image display screen side. As indicated in FIG. 4, a plasma display device 100 has a configuration in which a plasma display panel 2 (hereinafter referred to as "PDP"), circuit boards for driving the PDP 2 and the like are covered by a front cover 3 and a back cover 4.

It should be noted that the upward and downward direction means the upward and downward direction of a plasma display device in the normal use position (that is, the vertical direction), and the left and right direction means a direction orthogonal to this (that is, the horizontal direction) in the following description.

Figure 5:
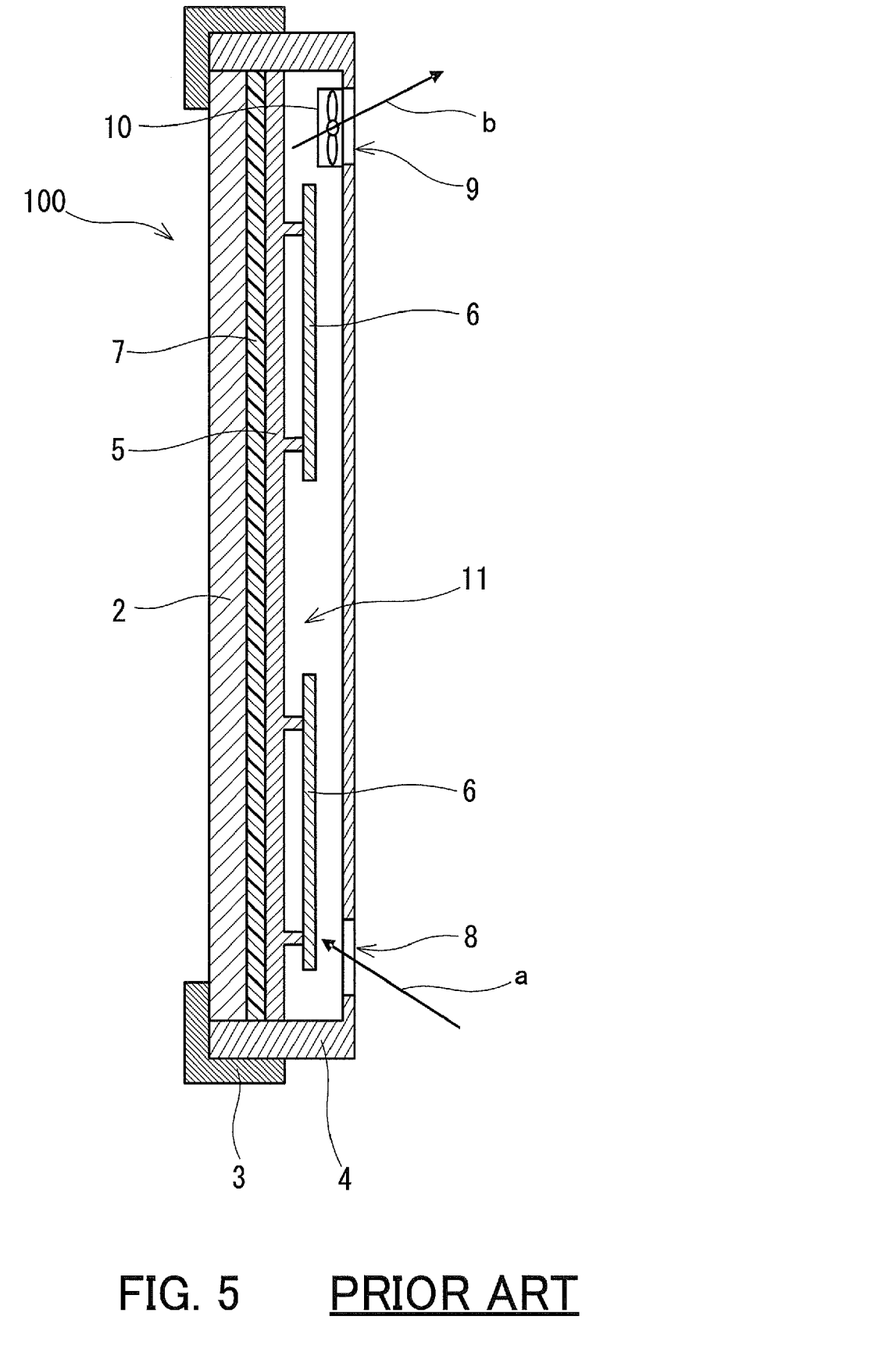
FIG. 5 is a schematic sectional view illustrating the conventional plasma display device.

FIG. 5 is a schematic sectional view showing the internal configuration of the conventional plasma display device 100. As indicated in FIG. 5, the PDP 2 for displaying images, a chassis 5 supporting the PDP 2 on the front surface, and a plurality of circuit boards 6 that are mounted to the back surface of the chassis 5 for driving the PDP 2 are accommodated inside the space surrounded by the front cover 3 and the back cover 4 in the plasma display device 100.

Here, the PDP 2 is likely to have a high temperature because of the principle of operation by which images are displayed using gas discharge. When the PDP 2 has a high temperature, the electrical capacity of the electrodes formed inside the PDP 2 changes, thus causing adverse effects such as the failure of normal discharge. For this reason, in order to maintain the PDP 2 at a predetermined temperature (for example, 70 to 80° C.) or less, a resin sheet 7 with high heat conductivity is interposed between the PDP 2 and the chassis 5, as indicated in FIG. 5. In this way, the heat in the PDP 2 is conducted effectively to the chassis 5, which allows the heat radiation effect and the temperature equalization effect to be obtained simultaneously.

Further, an air inlet 8 is provided in the lower part of the back cover 4, an air outlet 9 is provided in the upper part thereof, and a fan 10 is provided inside the back cover 4 so as to cover the air outlet 9. When the fan 10 is operated, airflow occurs between a space 11 inside the back cover 4 and the outside thereof, as illustrated by the arrows a and b in the figure. Thus, air at low temperature is taken in through the air inlet 8, so that the chassis 5 and the circuit boards 6 inside the back cover 4 are cooled by forced convection. Thereafter, air at high temperature is exhausted through the air outlet 9. It should be noted that although the air inlet 8 and the air outlet 9 each are a group of fine through holes in practice, FIG. 5 simply illustrates their existing locations generally.

Meanwhile, there is further progress recently in reducing the thickness of image display devices (for example, about 25 mm), and the depth of the space 11 defined by the chassis 5 and the back cover 4 has been decreasing significantly. With this reduction, the gap between the chassis 5 and the air-inlet surface of the fan 10 that faces the chassis 5 also is narrowed, which increases the resistance in the flow path, thereby reducing the amount of air to be moved by the fan 10. This deteriorates the cooling efficiency when cooling the chassis 5 and the circuit boards 6 inside the back cover 4 using forced convection. In order to prevent this, it is conceivable to increase the amount of the air to be moved by the fan 10 by increasing the driving voltage applied to the fan 10 to achieve a higher rotation rate of the fan 10. However, in that case, the noise from the fan 10 also increases, which interferes with the appreciation of the image display device. Therefore, it is desirable to reduce the noise from the fan 10.

For example, JP 2-19999 B proposes a structure for reducing the noise of a fan, relating to a computer housing, though it has no relationship to an image display device. In this structure, an air-outlet duct is provided so as to be connected to a fan discharge for cooling the inside of a housing, and a sound absorbing material in thin-layer form is attached onto the inner wall of the air-outlet duct.

Figure 6:
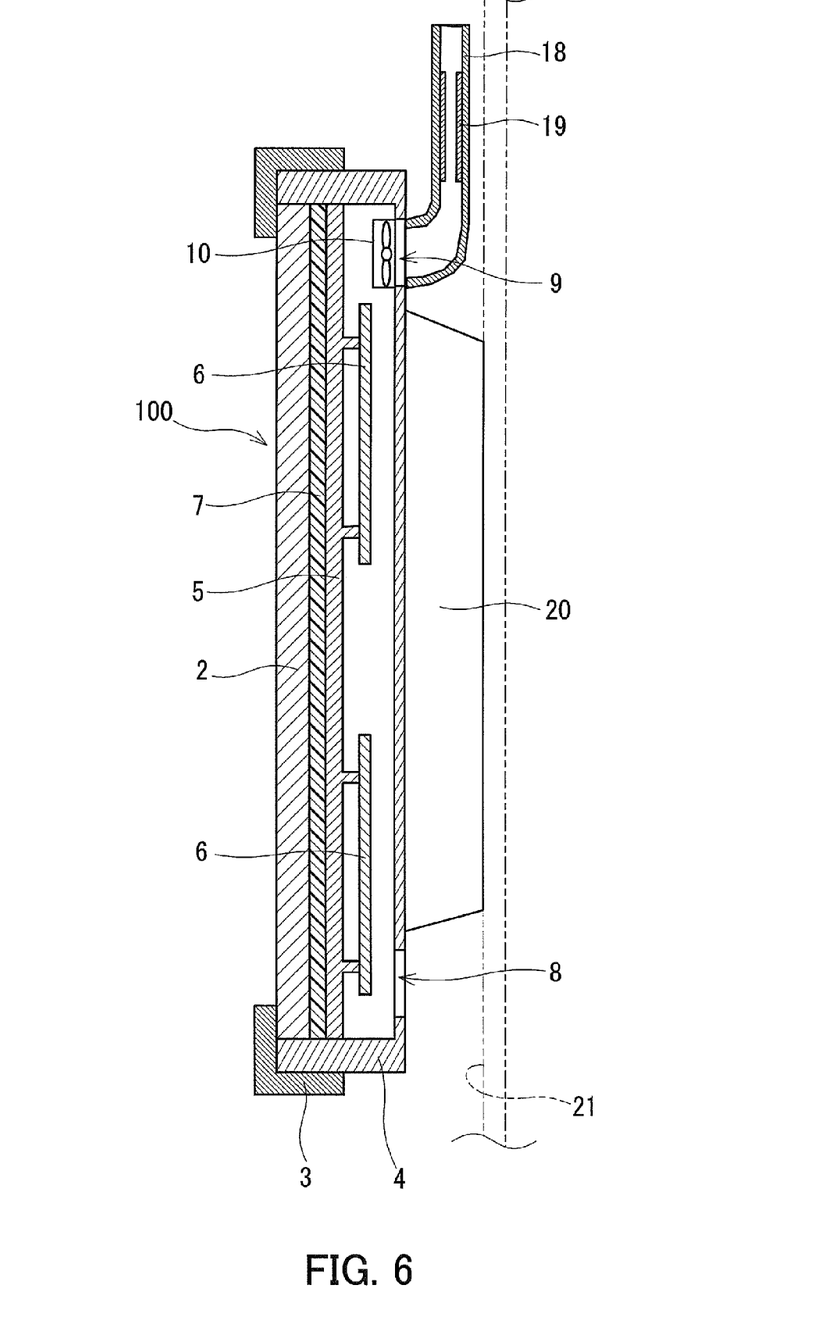
FIG. 6 is a schematic sectional view illustrating the conventional plasma display device to which the fan-noise reduction structure of JP 2-19999 B is applied.

FIG. 6 indicates a configuration in which the fan-noise reduction structure proposed in JP 2-19999 B is applied to the above-mentioned plasma display device 100 (when being wall mounted). That is, an air-outlet duct 18 is provided so as to be connected to the air outlet 9 of the back cover 4, and a sound absorbing material 19 in thin-layer form is attached onto the inner wall of the air-outlet duct 18. It should be noted that the plasma display device 100 is mounted to a wall 21 by a wall mounting jig 20 that is coupled onto the back cover 4, when being wall mounted.

However, when the air-outlet duct 18 is provided as indicated in FIG. 6, the flow rate of the air to be exhausted through the fan 10 decreases further because of the resistance in the flow path of the air-outlet duct 18. Further, the gap between the back cover 4 and the wall 21 (wall mounting gap) tends to be narrowed more and more in recent years, and thus it has become difficult to provide the air-outlet duct 18 itself.

SUMMARY OF THE INVENTION

In view of the above-mentioned problems, it is an object of the present invention to provide an image display device having a fan-noise reduction structure that is suitable for thickness reduction.

In order to solve the above-mentioned problems, the image display device of the present invention features that the image display device is provided with a display panel for displaying images, a chassis supporting the display panel on its front surface, circuit boards arranged within a specific region of the back surface of the chassis, a back cover having an edge portion that covers the outside of the specific region of the back surface of the chassis and a projecting portion that projects inside the edge portion toward the side opposite to the chassis and that accommodates the circuit boards, and a fan arranged inside the space defined by the projecting portion. In the image display device, the projecting portion includes a main wall facing the back surface of the chassis with the circuit boards interposed and a peripheral wall extending from the peripheral edge of the main wall toward the chassis. The peripheral wall is provided with an air inlet and air outlet, and the edge portion is provided with a sound absorbing material on its outer wall surface opposite to the chassis in the vicinity of the air outlet.

According to the above-mentioned configuration, the circuit boards are concentrically arranged, and these circuit boards are accommodated in the projecting portion of the back cover. Therefore, it is possible to ensure a space facing the edge portion of the back cover around the projecting portion of the back cover. Since the projecting portion of the back cover is provided with the air outlet on its peripheral wall, the air exhausted through the air outlet flows along the edge portion of the back cover. Further, since the edge portion of the back cover is provided with the sound absorbing material in the vicinity of the air outlet, the noise from the fan that leaks through the air outlet can be attenuated by the sound absorbing material. Thus, according to the present invention, it is possible to reduce the noise from the fan by providing the sound absorbing material while rationally using the shape of the back cover.

DETAILED DESCRIPTION OF THE INVENTION

Hereinafter, embodiments for carrying out the present invention is described with reference to the drawings. It should be noted that the following embodiments are described as an example, and the present invention is not limited thereto. Further, a plasma display device is used as an example of an image display device in the following description, as is the conventional example.

Figure 1:
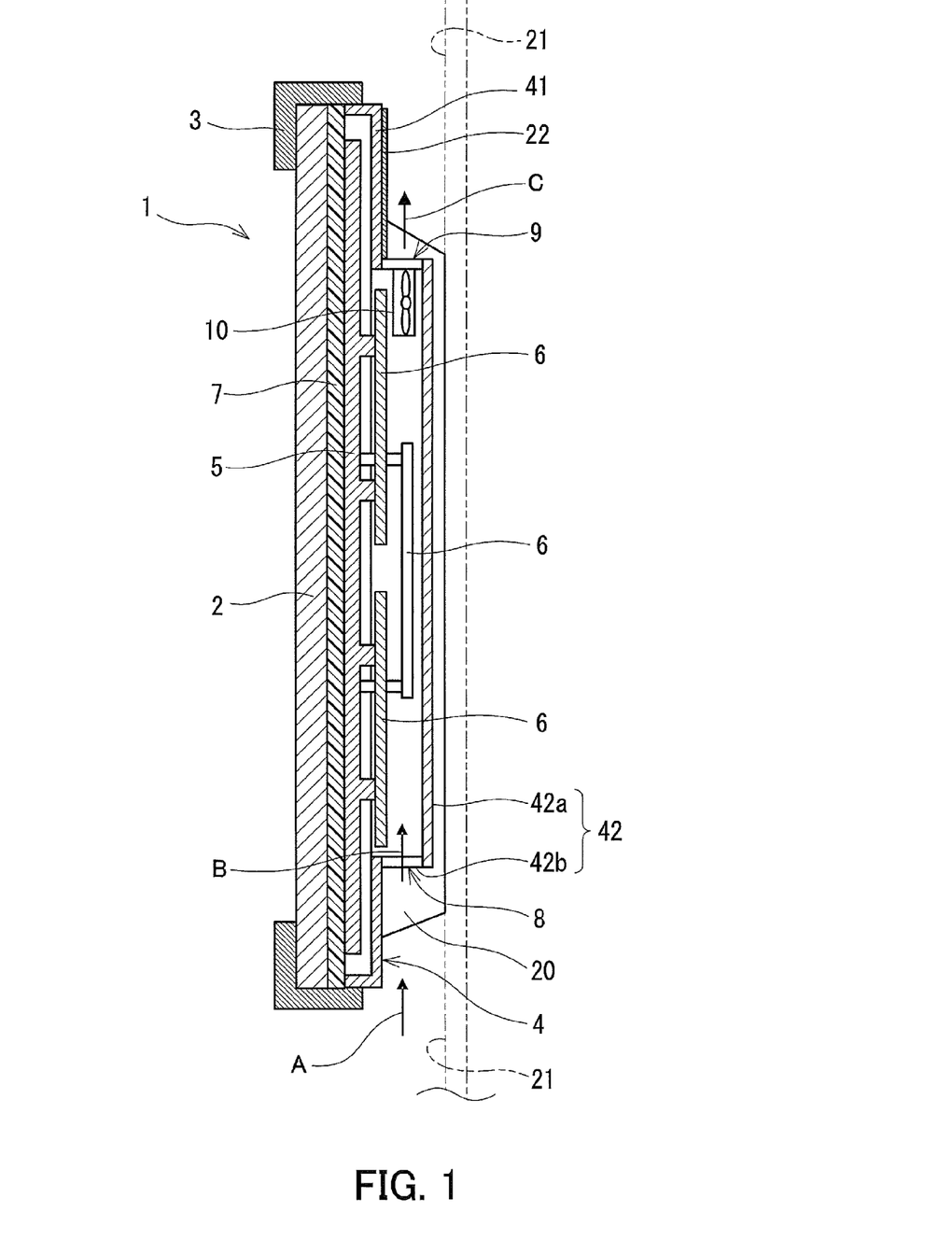
FIG. 1 is a schematic sectional view illustrating an image display device according to one embodiment of the present invention.
Figure 2:
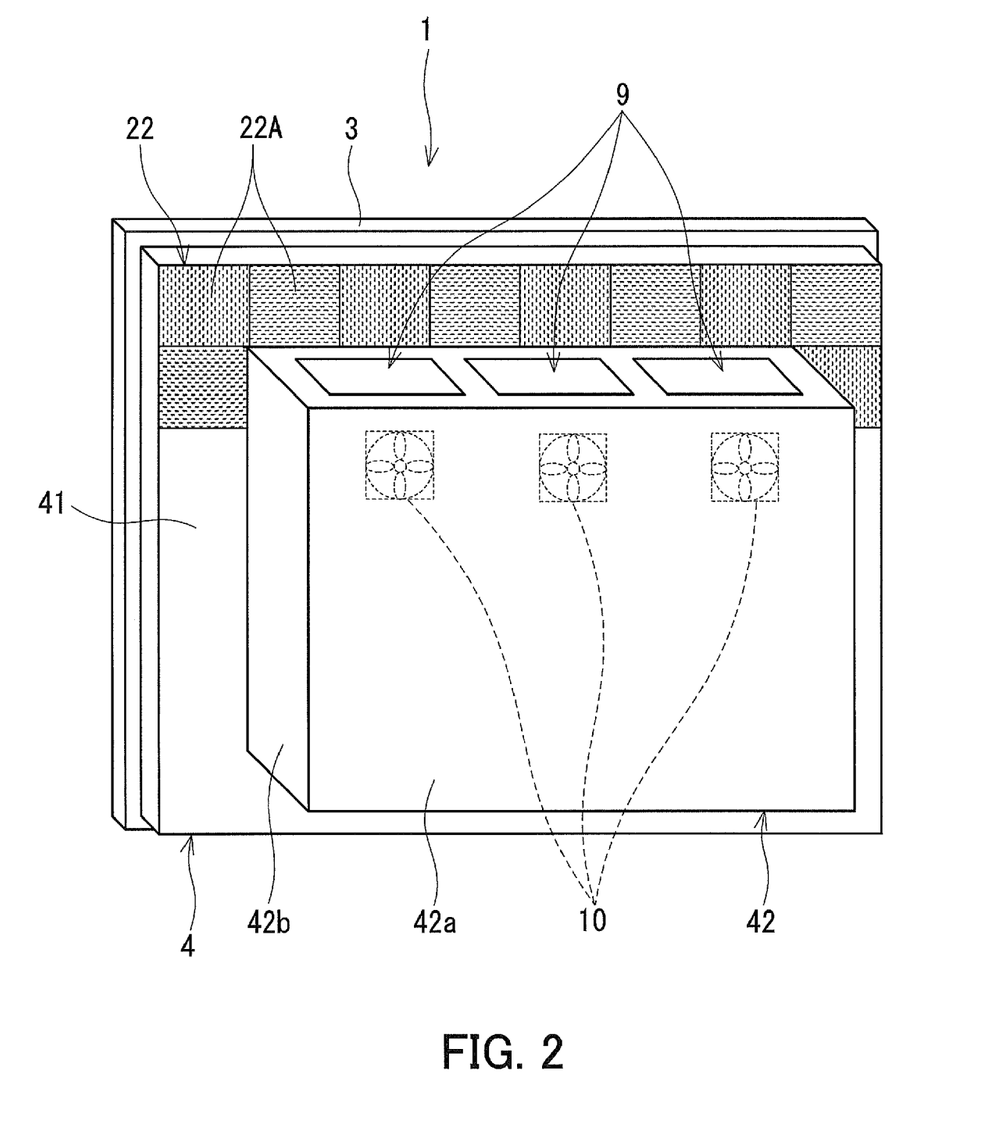
FIG. 2 is a schematic perspective view illustrating the image display device indicated in FIG. 1 as viewed from the back side.

FIG. 1 and FIG. 2 indicate a plasma display device 1 according to one embodiment of the present invention. The plasma display device 1 basically has the same configuration as the conventional plasma display device 100 indicated in FIG. 5. That is, the plasma display device 1 is provided with the PDP (display panel) 2 for displaying images, the chassis 5 supporting the PDP 2 on the front surface, and a plurality of the circuit boards 6 mounted to the back surface of the chassis 5 for driving the PDP 2. The PDP 2, the chassis 5 and the circuit boards 6 are accommodated inside the space surrounded by the front cover 3 and the back cover 4.

The PDP 2 has an elongated shape, and generally is positioned in a manner so that the longitudinal direction is the horizontal direction and the short direction is the vertical direction. FIG. 1 is a view that assumes the PDP 2 as viewed by a user in a wall mounted state, in which the plasma display device 1 is mounted to the wall 21 by the wall mounting jig 20 that is coupled onto the back cover 4. In FIG. 2, the wall mounting hardware 20 is omitted.

Specifically, the PDP 2 is formed by a front glass substrate and a back glass substrate bonded to each other, though the illustration thereof is omitted. On the front glass substrate, a number of display electrode pairs each formed of a scanning electrode and a sustaining electrode are formed, extending in the left and right direction. On the back glass substrate, a number of address electrodes are formed, extending in the upward and downward direction.

The resin sheet 7 with high heat conductivity is interposed between the PDP 2 and the chassis 5 supporting the PDP 2. The resin sheet 7 has almost the same rectangular shape and area as the PDP 2 when viewed from the front, and has a thickness, for example, of about 1 to 2 mm. The effect of heat conduction from the PDP 2 to the chassis 5 is enhanced by the resin sheet 7 interposed between the PDP 2 and the chassis 5 to allow the PDP 2 that is formed basically by glass substrates to be in close contact with the chassis 5 that is metal. For this reason, silicon or the like that has flexibility and heat conductivity in combination is suitable as a material of the resin sheet 7.

The chassis 5 is a metal plate, has almost the same shape and area as the PDP 2 when viewed from the front, and has a thickness, for example, of about 1.5 mm. The chassis 5 serves to support the entire device by holding the PDP 2 inside the front cover 3 and the back cover 4. It also serves to diffuse the heat conducted from the PDP 2 via the resin sheet 7 in the in-plane direction of the chassis 5 itself so that the temperature is equalized, and to radiate the heat into the space between the chassis 5 and the back cover 4. Therefore, aluminum or the like that has good heat conductivity is used as a material of the chassis 5.

The circuit boards 6 are mounted to the back surface of the chassis 5, by being screwed into the bosses of the chassis 5 in parallel to the PDP 2. The circuit boards 6 constitute a power supply and a tuner for displaying images, and further a signal processing circuit and a drive circuit that give signals to the electrodes of the PDP 2 for displaying images. In this embodiment, the circuit boards 6 are arranged within a specific region of the back surface of the chassis 5 so as to be concentrated around the center of the back surface thereof. That is, the specific region of the back surface of the chassis 5 is a center portion except for the periphery of the back surface.

The front cover 3 and the back cover 4 are formed so as to be capable of covering the PDP 2 and the chassis 5 to which the circuit boards 6 are mounted. The front cover 3, for example, is made of aluminum, having a thickness of about 1 mm. The back cover 4, for example, is made of steel, having a thickness of about 0.5 mm. Among these, the front cover 3 also serves as an escutcheon frame that covers the periphery of the image display screen of the PDP 2. On the other hand, the back cover 4 covers the back surface of the chassis 5 over the circuit boards 6.

Specifically, the back cover 4 has an edge portion 41 that covers the outside of the specific region of the back surface of the chassis 5, and a projecting portion 42 that projects toward the side opposite to the chassis 5 inside the edge portion 41 and that accommodates the circuit boards 6.

In this embodiment, since the specific region is the center portion of the back surface of the chassis 5, the edge portion 41 that covers the outside thereof has a rectangular frame shape, as viewed from the back. However, the shape of the edge portion 41 is not limited thereto, and it also is possible that the specific region that defines the region where the circuit boards 6 are present is in contact with the lower side of the back surface of the chassis 5, and the edge portion 41 has a downwardly opening U shape, as viewed from the back, corresponding to it, for example.

Further, the width of the edge portion 41, that is, the length from the inner edge to the outer edge of the edge portion 41 may differ in the upper side, the lower side, and the lateral sides of the specific region. For example, the edge portion 41 may have a shape in which the lower side and the lateral sides of the specific region have a smaller width than the upper side of the specific region.

The projecting portion 42 has a main wall 42a that faces the back surface of the chassis 5 with the circuit boards 6 interposed, and a peripheral wall 42b that extends from the peripheral edge of the main wall 42a toward the chassis 5 and that connects the peripheral edge of the main wall 42a to the inner edge of the edge portion 41. The peripheral wall 42b has a laterally long rectangular tubular shape, and has an upper side portion that constitutes the upper surface of the projecting portion 42, a lower side portion that constitutes the lower surface of the projecting portion 42, and a pair of side portions that constitute the left and right side surfaces of the projecting portion 42.

In order to cool the chassis 5 and prevent the temperature of the PDP 2 from increasing, air inlets 8 are provided in the lower side portion of the peripheral wall 42b for taking in external air, and air outlets 9 are provided in the upper side portion of the peripheral wall 42b for exhausting the internal air to the outside. Further, the fans 10 are arranged in the vicinity of the air outlets 9 inside the space defined by the projecting portion 42. In this embodiment, the air inlets 8 and the air outlets 9 are provided at three points so as to be aligned laterally. Further, the fans 10 also are arranged at three points corresponding to the air outlets 9 respectively.

In this embodiment, a centrifugal fan capable of drawing air from both sides of the axis direction is employed as each fan 10, which is oriented so that the axis direction coincides with the thickness direction of the PDP 2. However, when the projection depth of the projecting portion 42 from the edge portion 41 is allowed to be large (for example, about 60 mm or more), an axial fan may be employed as the fan 10 and arranged sideways. The fan 10 may be fixed to the main wall 42a of the back cover 4, or may be fixed to the chassis 5.

Furthermore, a sound absorbing material 22 is provided in the vicinity of the air outlets 9 on the outer wall surface of the edge portion 41 of the back cover 4 on the side opposite to the chassis 5. The sound absorbing material 22 is attached onto the outer wall surface of the edge portion 41 via a resin sheet that is adhesive at high temperature. In this embodiment, the sound absorbing material 22 is formed by a plurality of rectangular component pieces 22A, as indicated in FIG. 2, and these component pieces 22A are arranged continuously over the entire horizontally long portion located above the projecting portion 42 to the upper part of the vertically long portions located at the left and right of the projecting portion 42, on the outer side surface of the edge portion 41.

Figure 3:
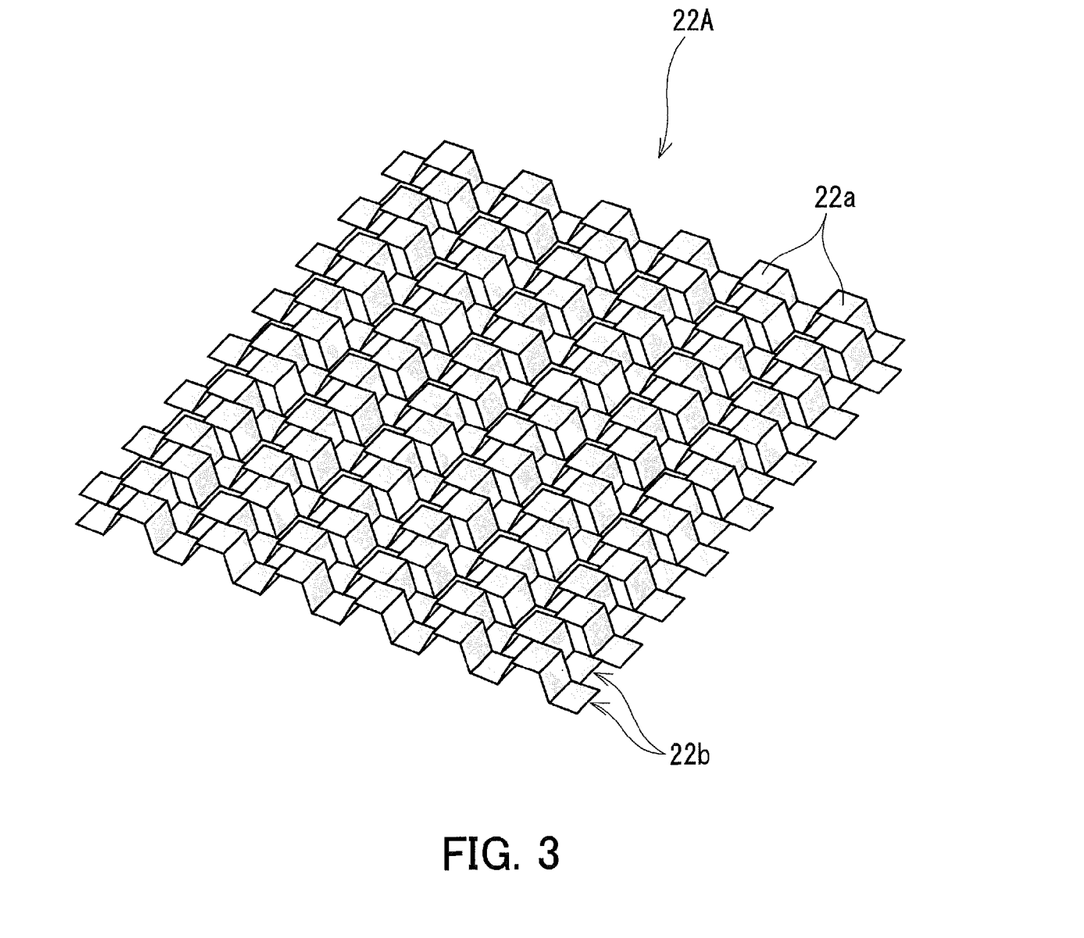
FIG. 3 is a schematic perspective view illustrating the shape of a sound absorbing material to be used for the image display device indicated in FIG. 1.

Each component piece 22A is a fin having a plurality of projections 22a as indicated in FIG. 3. The fin is press formed so that projection lines 22b in which the projections 22a are formed repeatedly are aligned in the direction orthogonal to the projection lines 22b while the positions of the projections 22a are shifted. Such a fin can be formed, for example, by a thin plate made of aluminum with a thickness of about 50 μm, and the height of the projections 22a is, for example, about 1 mm.

Hereinafter, the airflow of forced-air cooling in the plasma display device 1 according to this embodiment is described with reference to FIG. 1.

In the plasma display device 1, air for cooling is supplied from below the plasma display device 1 in the direction of the arrow A. External air is taken in the projecting portion 42 of the back cover 4 through the air inlets 8 in the direction of the arrow B to cool the chassis 5 and the circuit boards 6, and the heated air is exhausted through the air outlets 9 by the fans 10 in the direction of the arrow C The sound absorbing material 22 is provided almost in parallel to the direction C of the exhaust airflow through the air outlets 9, and therefore the noise from the fans 10 that leaks out through the air outlets 9 can be reduced without disturbing the exhaust airflow.

As seen from above, in the plasma display device 1 of this embodiment, the circuit boards 6 are concentrically arranged, and these circuit boards 6 are accommodated in the projecting portion 42 of the back cover 4, so that the space facing the edge portion 41 of the back cover 4 can be ensured around the projecting portion 42 of the back cover 4. Since the air outlets 9 are provided on the peripheral wall 42b of the projecting portion 42 of the back cover 4, air to be exhausted through the air outlets 9 flows along the edge portion 41 of the back cover 4. Furthermore, since the sound absorbing material 22 is provided in the vicinity of the air outlets 9 in the edge portion 41 of the back cover 4, the noise from the fans 10 that leaks out through the air outlets 9 can be attenuated by the sound absorbing material 22. Thus, according to this embodiment, the sound absorbing material 22 is provided while rationally using the shape of the back cover 4, thereby reducing the noise from the fans 10.

It should be noted that although a fin is used as the sound absorbing material 22 in the above-mentioned embodiment, the sound absorbing material 22 may be metal wool with very small wire diameter that is packed into a flat plate shape. However, when a fin is used as the sound absorbing material 22, as is the case of this embodiment, the heat conducted from the chassis 5 to the edge portion 41 of the back cover 4 by radiation can be transferred efficiently to the air to be exhausted through the air outlets 9, and it is thus possible to prevent the heat from being retained between the chassis 5 and the back cover 4.

Further, when the plasma display device 1 is wall mounted, similar effects can be obtained, of course, by providing the sound absorbing material 22 on a portion of the wall 21 that faces the edge portion 41 of the back cover 4.

Furthermore, it also is possible to provide the air outlets 9 on the main wall 42a of the projecting portion 42 of the back cover 4, while providing axial fans respectively covering the air outlets 9. In this case, the air exhausted through the air outlets 9 by the axial fans collides with the wall 21 to be allowed to flow along the wall 21. The sound absorbing material 22 may be provided on the wall 21, or may be provided on the main wall 42a of the projecting portion 42, so as to be in contact with the exhaust air. Also in this case, effects similar to the above-mentioned embodiment can be obtained, because the sound absorbing material 22 is in parallel to the flow direction of the exhaust air.

Although a plasma display device is described as an example of a thin display device in the above-mentioned description, the present invention is effective in reducing the fan noise also when other image display devices such as a liquid crystal display are used in a wall mounted state.

The present invention may be embodied in other forms without departing from the spirit or essential characteristics thereof. The described embodiments disclosed in this specification are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An image display device comprising:
   a display panel for displaying an image;
   a chassis supporting the display panel on its front surface;
   circuit boards arranged within a specific region of a back surface of the chassis;
   a back cover having an edge portion that covers the outside of the specific region of the back surface of the chassis and a projecting portion that projects inside the edge portion toward the side opposite to the chassis and that accommodates the circuit boards; and a fan arranged inside a space defined by the projecting portion, wherein the projecting portion includes a main wall facing the back surface of the chassis with the circuit board interposed and a peripheral wall extending from the peripheral edge of the main wall toward the chassis, the peripheral wall is provided with an air inlet and an air outlet, and the edge portion is provided with a sound absorbing material on its outer wall surface opposite to the chassis in the vicinity of the air outlet, wherein the sound absorbing material is a fin having a plurality of projections.

2. The image display device according to claim 1, wherein the fin is press formed so that projection lines in which the projections are formed repeatedly are aligned in a direction orthogonal to the projection lines while positions of the projections are shifted.

* * * * *